(12) United States Patent
Murray et al.

(10) Patent No.: US 11,855,226 B2
(45) Date of Patent: Dec. 26, 2023

(54) THIN FILM TRANSISTOR, SEMICONDUCTOR DEVICE AND METHOD OF FABRICATING THIN FILM TRANSISTOR

(71) Applicant: Taiwan Semiconductor Manufacturing Company, Ltd., Hsinchu (TW)

(72) Inventors: Neil Quinn Murray, Hsinchu (TW); Hung-Wei Li, Hsinchu (TW); Mauricio Manfrini, Hsinchu County (TW); Sai-Hooi Yeong, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 182 days.

(21) Appl. No.: 17/389,345

(22) Filed: Jul. 30, 2021

(65) Prior Publication Data

US 2023/0034708 A1    Feb. 2, 2023

(51) Int. Cl.
| | | |
|---|---|---|
| *H01L 21/00* | (2006.01) | |
| *H01L 27/00* | (2006.01) | |
| *H01L 29/00* | (2006.01) | |
| *H01L 29/786* | (2006.01) | |
| *H01L 29/66* | (2006.01) | |
| *H01L 27/12* | (2006.01) | |
| *H01L 21/8258* | (2006.01) | |

(52) U.S. Cl.
CPC .... *H01L 29/78618* (2013.01); *H01L 21/8258* (2013.01); *H01L 27/12* (2013.01); *H01L 29/6656* (2013.01); *H01L 29/66742* (2013.01); *H01L 29/7869* (2013.01)

(58) Field of Classification Search
CPC ........... H01L 29/78618; H01L 29/6656; H01L 29/66742; H01L 29/7869; H01L 21/823475; H01L 21/8234; H01L 21/8258; H01L 27/0688; H01L 27/06; H01L 27/088; H01L 27/1225; H01L 27/12; H01L 29/66; H01L 29/417; H01L 29/41733; H01L 29/66969
See application file for complete search history.

(56) References Cited

U.S. PATENT DOCUMENTS

| | | | |
|---|---|---|---|
| 8,383,490 B2 * | 2/2013 | Fan .................... | H01L 29/41783 438/296 |
| 8,569,803 B2 * | 10/2013 | Tyberg .................. | H01L 27/124 257/377 |
| 8,728,332 B2 | 5/2014 | Lin et al. | |

(Continued)

*Primary Examiner* — Nikolay K Yushin
(74) *Attorney, Agent, or Firm* — JCIPRNET

(57) ABSTRACT

A thin film transistor, a semiconductor device having a thin film transistor and a method of fabricating a thin film transistor are provided. The thin film transistor includes a gate metal; a gate dielectric layer disposed on the gate metal; a semiconductor layer disposed on the gate dielectric layer; an interlayer dielectric disposed on the semiconductor layer and having a contact hole over the semiconductor layer; a source/drain metal disposed in the contact hole; a first liner disposed between the interlayer dielectric and the source/drain metal; and a second liner disposed between the first liner and the source/drain metal and being in contact with the semiconductor layer in the contact hole.

20 Claims, 10 Drawing Sheets

(56) References Cited

U.S. PATENT DOCUMENTS

| | | | |
|---|---|---|---|
| 8,796,666 B1 | 8/2014 | Huang et al. | |
| 8,822,243 B2 | 9/2014 | Yan et al. | |
| 8,987,142 B2 | 3/2015 | Lee et al. | |
| 9,053,279 B2 | 6/2015 | Chang et al. | |
| 9,093,530 B2 | 7/2015 | Huang et al. | |
| 9,099,530 B2 | 8/2015 | Lin et al. | |
| 9,153,478 B2 | 10/2015 | Liu et al. | |
| 9,501,601 B2 | 11/2016 | Chang et al. | |
| 9,548,303 B2 | 1/2017 | Lee et al. | |
| 10,861,765 B2 * | 12/2020 | Derderian | B32B 38/10 |
| 2012/0305929 A1 * | 12/2012 | Tyberg | H01L 23/53271 |
| | | | 257/66 |
| 2013/0026570 A1 * | 1/2013 | Fan | H01L 29/0653 |
| | | | 438/430 |
| 2019/0067022 A1 * | 2/2019 | Lin | H01L 21/76877 |
| 2020/0091274 A1 * | 3/2020 | Sharma | H01L 29/4908 |
| 2021/0399136 A1 * | 12/2021 | Vellianitis | H01L 29/66969 |

\* cited by examiner

THIN FILM TRANSISTOR, SEMICONDUCTOR DEVICE AND METHOD OF FABRICATING THIN FILM TRANSISTOR

BACKGROUND

For achieving a simplified, cost-effective, 3D semiconductor device, BEOL (Back End of Line) compatible components are provided. The BEOL compatible components are fabricated by a method that could be formed from primarily existing steps and would be compatible with the processing requirements of the BEOL interconnect levels. For example, a BEOL compatible oxide semiconductor thin-film transistor is applicable in kinds of devices such as a memory device. Implementation of components into the BEOL wiring levels using primarily standard BEOL processing steps would enable a more cost effective path to 3D integration as compared with the existing prior art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
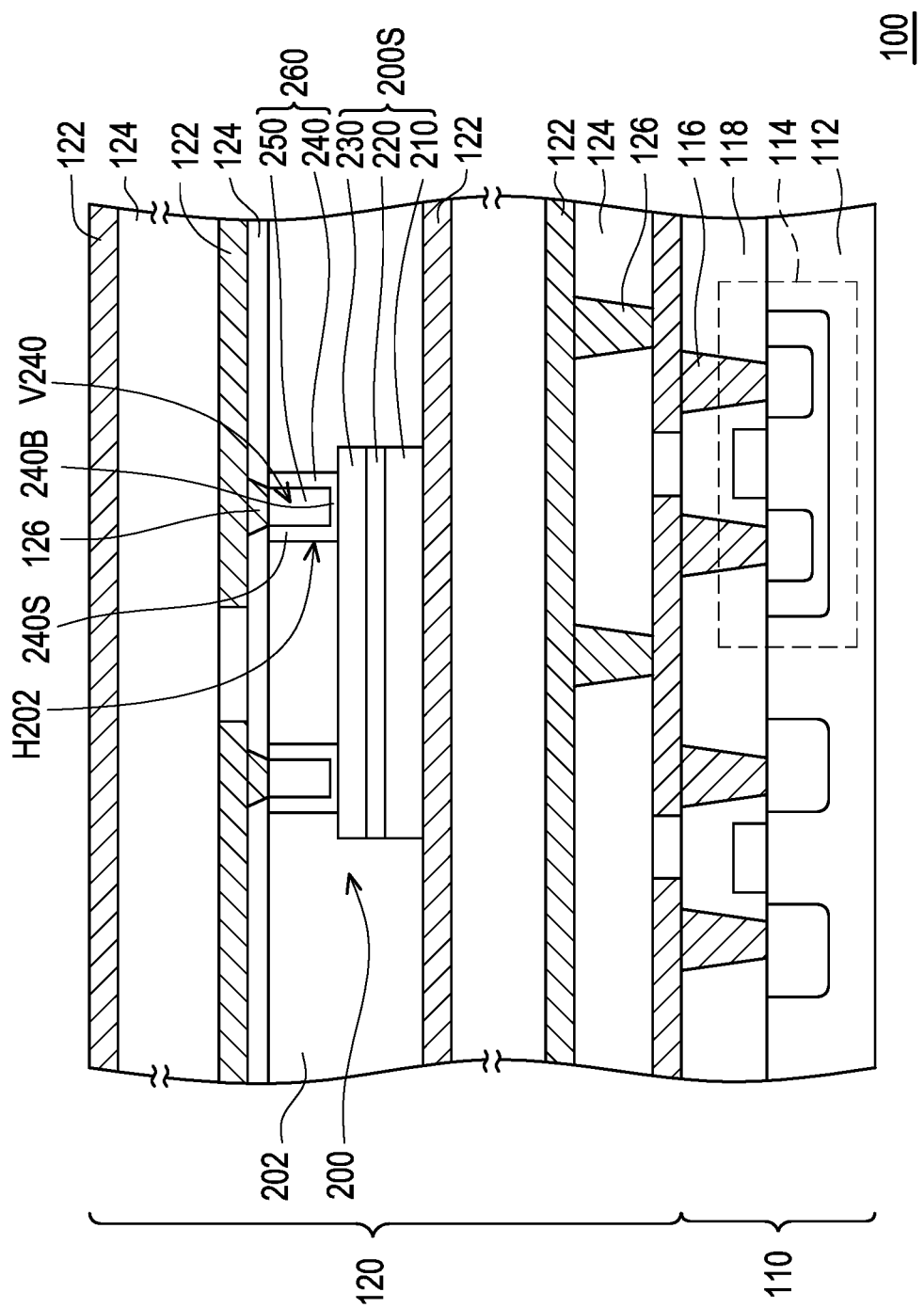
FIG. 1 schematically illustrates a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described above in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

FIG. 1 schematically illustrates a semiconductor device in accordance with some embodiments of the disclosure. In FIG. 1, a semiconductor device 100 includes a semiconductor structure 110, an interconnect structure 120 and a thin film transistor 200. In the embodiment, the interconnect structure 120 is disposed on the semiconductor structure 110 and the thin film transistor 200 is formed integrated in the interconnect structure 120.

The semiconductor structure 110 may include a semiconductor substrate 112 and a semiconductor component 114 formed integrated in the semiconductor substrate 112. The semiconductor substrate 112 can be a silicon substrate or a semiconductor substrate formed of other semiconductor materials. For example, the material of the semiconductor substrate 112 can include silicon, silicon germanium, silicon carbon, III-V compound semiconductor material, or the like. In some embodiments, the semiconductor substrate 112 is lightly doped with a p-type impurity, but the present disclosure is not limited thereto. The semiconductor component 114 can include transistors, diodes, resistors, CMOS devices or the like that are fabricated by manufacturing processes of front-end-of-the-line (FEOL) in a semiconductor manufacture field. In some embodiments, the semiconductor structure 110 may further include a contact structure 116 that is used for connecting the semiconductor component 114 to the interconnect structure 120 and fabricated by manufacturing processes of middle-end-of-the-line (MEOL) in the semiconductor manufacture field. In some embodiments, a pre-metal dielectric layer 118 can be disposed on the semiconductor substrate 110 to cover the semiconductor component 114 and the contact structure 116 is formed extending through the pre-metal dielectric layer 118 to contact the semiconductor component 114.

The interconnect structure 120 can include contact pads, interconnect wires, vias and dielectric structures and can be electrically connected to the semiconductor component 114. Specifically, the interconnect structure 120 includes metal layers 122 and interlayer dielectric layers 124 alternately disposed on the semiconductor structure 110. The interconnect structure 120 can further include vias 126 that connect different layers of the metal layers 122 and each of the metal layers 122 is patterned so as to create the required electric transmission route. For illustration purpose, the metal layers 122 in FIG. 1 are sequentially labeled as M0, M1, My−1, My and Mn from the semiconductor structure 110, and n is the total number of the metal layers 122 in the interconnect structure 120.

The thin film transistor 200 can be a planar transistor that is built and/or embedded in the interconnect structure 120. The thin film transistor 200 can serve as an I/O circuitry for connecting to external high-voltage component, or serve as a selector for an embedded memory device or a standalone memory device in various embodiments, but not limited thereto. Specifically, the thin film transistor 200 is disposed between two adjacent metal layers My and My−1 of the plurality of metal layers 122 in the interconnect structure 120. In some embodiments, y can be a positive integer that is from 1 to n. In some embodiments, y can be a positive integer that satisfies the formula: $4 \leq y \leq (n-1)$. In the embodiment, the thin film transistor 200 is embedded in an interlayer dielectric 202 of the interlayer dielectric layers 124 between the metal layer My and the metal layer My−1.

The thin film transistor 200 includes the interlayer dielectric 202, a gate metal 210, a gate dielectric layer 220, a semiconductor layer 230, a liner structure 240 and a source/drain metal 250. In the embodiment, the interlayer dielectric 202 has a through hole H202, and the liner structure 240 and the source/drain metal 250 construct a source/drain structure 260 that is disposed in the through hole H202. In addition, the thin film transistor 200 can include two, paired source/drain structures 260 in contact with separate regions of the semiconductor layer 230 above the gate metal 210 so that the gate metal 210, the paired source/drain structures 260 serve as three terminals of the thin film transistor 200. In the thin film transistor 200, the region of the semiconductor layer 230 between the pair of source/drain structures 260 defines the channel region.

The gate metal 210 is disposed on the metal layer My−1, the gate dielectric layer 220 is disposed on the gate metal 210 and the semiconductor layer 230 is disposed on the gate dielectric layer 220. The gate metal 210, the gate dielectric layer 220 and the semiconductor layer 230 are stacked in sequence to form a stack structure 200S. The gate metal 210 can include a metal material selected from W, TiN, Mo or the like. In some embodiments, a thickness of the gate metal 210 can be ranged from 50 angstroms to 500 angstroms. The gate dielectric layer 220 can include a dielectric material selected from $AlO_x$, $HfO_x$, HZO (hafnium zirconium oxide) or the like and can have a thickness ranged from 30 angstroms to 150 angstroms. The semiconductor layer 230 can be an oxide semiconductor layer and made of a semiconductor material selected from IGZO, IZO, or the like. The semiconductor layer 230 can have a thickness ranged from 30 angstroms to 200 angstroms. The gate metal 210, the gate dielectric layer 220 and the semiconductor layer 230 in the stack structure 200S can be aligned in structure, but not limited thereto.

The interlayer dielectric 202 is disposed over the semiconductor layer 230 and covers the stack 200S. The stack 200S can be formed embedded in the interlayer dielectric 202. The interlayer dielectric 202 has a contact hole H202 over the semiconductor layer 230, such that a portion of the semiconductor layer 230 is not covered by and not in contact with the interlayer dielectric 202 at the contact hole H202. In some embodiments, the interlayer dielectric 202 as well as other dielectric layers of the interlayer dielectric layer 124 can be made of a dielectric material selected from $SiO_x$ or the like and have a thickness ranged from 50 angstroms to 500 angstroms.

The source/drain structure 260 includes the liner structure 240 and the source/drain metal 250. The source/drain metal 250 is disposed in the contact hole H202 of the interlayer dielectric 202 and laterally surrounded by the interlayer dielectric 202. In addition, the liner structure 240 is interposed between the source/drain metal 240 and the interlayer dielectric 202 and between the source/drain metal 240 and the semiconductor layer 230. In the embodiment, the liner structure 240 disposed in the contact hole H202 and forms an accommodating volume V240 with n the contact hole H202. The source/drain metal 250 fills the accommodating volume V240, so that the liner structure 240 is interposed between the source/drain metal 250 and the semiconductor layer 230 and between the source/drain metal 250 and the interlayer dielectric 202. In addition, the top of the source/drain metal 250 is in contact with a corresponding via 126 of the interconnect structure 120 so that the source/drain metal 250 in the source/drain structure 260 is electrically connected to the metal layer My above the thin film transistor 200.

The liner structure 240 can have an uneven thickness, and for example, the liner structure 240 can have a thicker thickness at a sidewall 240S than at a bottom 240B. In some embodiments, the liner structure 240 can be formed by multiple liners and for example, the quantity of the liners forming the sidewall 240S is different from the quantity of the liners forming the bottom 240B. The source/drain metal 250 can be made of the metal material selected from TiN, Ti, W, Mo, or the like and have a thickness ranged from 100 angstroms to 500 angstroms. In some embodiments, the source/drain metal 250 and the liner structure 240 can be coplanar at the side away from the semiconductor layer 230 and leveled with the top surface of the interlayer dielectric 202.

Figure 2:
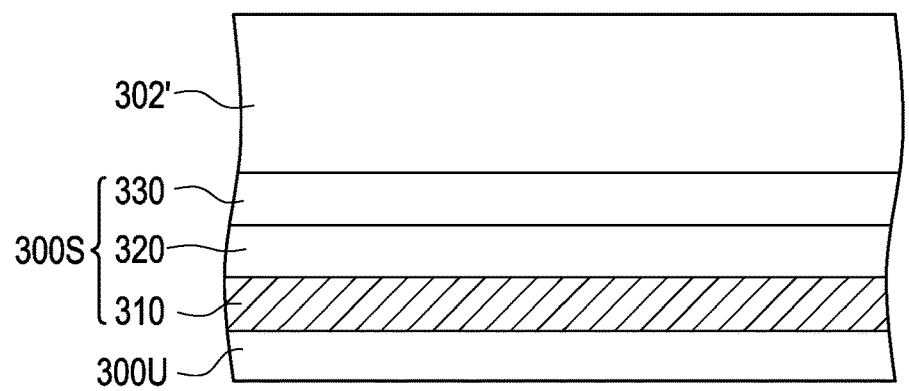
FIG. 2 through FIG. 7 schematically illustrate cross sectional structures showing respective steps of a method of fabricating a thin film transistor in accordance with some embodiments.

FIG. 2 through FIG. 7 schematically illustrate cross sectional structures showing respective steps of a method of fabricating a thin film transistor in accordance with some embodiments. The method depicted and the thin film transistor in FIG. 2 to FIG. 7 can be an exemplary implemental example of the thin film transistor 200 shown in FIG. 1 and the respective steps depicted in FIG. 2 to FIG. 7 are compatible with the method of fabricating the interconnect structure 120 shown in FIG. 1, i.e. the manufacturing processes of BEOL. In FIG. 2, a stack structure 300S is formed on an underlying layer 300U. The stack structure 300S includes a gate metal 310, a gate dielectric layer 320 and a semiconductor layer 330 that are stacked in sequence on the underlying layer 300U. In some embodiments, the underlying layer 300U can be a metal layer such as the metal layer My−1 shown in FIG. 1, or other layer that is able to support the stack structure 300S.

The gate metal 310, the gate dielectric layer 320 and the semiconductor layer 330 are similar to the gate metal 210, the gate dielectric layer 220 and the semiconductor layer 230 of FIG. 1. The gate metal 310 can include a metal material selected from W, TiN, Mo or the like. The gate dielectric layer 320 may be made of or include hafnium oxide, zirconium oxide, aluminum oxide, hafnium dioxide-alumina alloy, hafnium silicon oxide, hafnium lanthanum oxide, hafnium silicon oxynitride, hafnium tantalum oxide, hafnium titanium oxide, hafnium zirconium oxide, one or more other suitable high-K materials, ferroelectrics, other memory layer material, or a combination thereof. The semiconductor layer 330 can include a semiconductor material selected from IGZO (InGaZnO), IZO (InZnO), other transition metal oxide or the like.

In addition, in the step of FIG. 2, an dielectric material layer 302' is formed on the stack structure 300S by using a deposition process such as CVD (chemical vapor deposition) process, PVD (physical vapor deposition) process, ALD (atomic layer deposition) process, or the like. In some embodiments, CVD process can include plasma-enhanced chemical vapor deposition (PECVD) techniques or high-density plasma CVD (HDPCVD). In some embodiments, the dielectric material layer 302' can be made of or include silicon oxide, silicon oxynitride, borophosphosilicate glass (BPSG), fused silica glass (FSG), phosphosilicate glass (PSG), boron doped silicon glass (BSG), low-k material, porous dielectric material, one or more other suitable materials, or a combination thereof.

Figure 3:
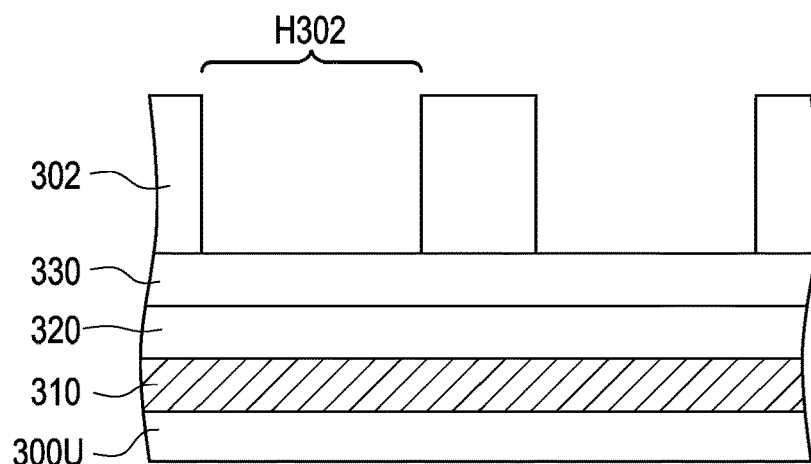

In FIG. 3, a patterning process is performed on the dielectric material layer 302' to form an interlayer dielectric 302 having a contact hole H302 therein. The contact hole H302 is formed by removing a portion of the dielectric material layer 302' on the semiconductor layer 330 so that the contact hole H302 is formed to expose semiconductor layer 330. The material of the dielectric material layer 302' is completely removed in the contact hole H302 and the material of the semiconductor layer 330 is exposed at the contact hole H302. In some embodiments, the patterning process for forming the contact hole H302 includes, but not limited to a photolithography process, a laser removing process, or other process that is compatible to the manufacturing processes of BEOL. In some embodiments, two contact holes H302 can be formed over the semiconductor layer 330 and the two contact holes H302' are separated from each other to define a pair of source/drain structures.

Figure 4:
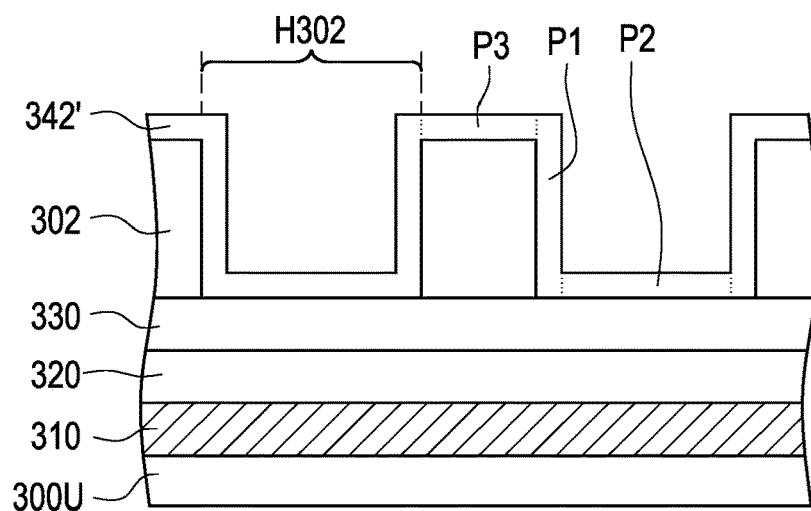

In FIG. 4, a first liner material layer 342' is formed on the interlayer dielectric 302. The first liner material layer 342' can be formed by a deposition process such as CVD (chemical vapor deposition) process, PVD (physical vapor deposition) process, ALD (atomic layer deposition) process, or the like. A material of the first liner material layer 342' can be non-nitride based material and can include oxides, metal material, semiconductor material, or the like. For example, the material of the first liner material layer 342' can be selected from silicon oxide, aluminum oxide, lanthanum oxide, or the like. In some embodiments, the material of the first liner material layer 342' can be selected from TiN, W, Mo, or the like. In some embodiments, the first liner material layer 342 may present a barrier effect for preventing hydrogen diffusion from the interlayer dielectric 302. The first liner material layer 342' is formed in a conformal manner over the structure constructed by the interlayer dielectric 302 and the semiconductor layer 330. Specifically, the first liner material layer 342' includes a first portion P1 in contact with the interlayer dielectric 302 at a sidewall of the contact hole H302, a second portion P2 in contact with the semiconductor layer 330 within the contact hole H302 and a third portion P3 in contact with a top surface of the interlayer dielectric 302. The first portion P1 extends continuously and vertically between the second portion P2 and the third portion P3.

Figure 5:
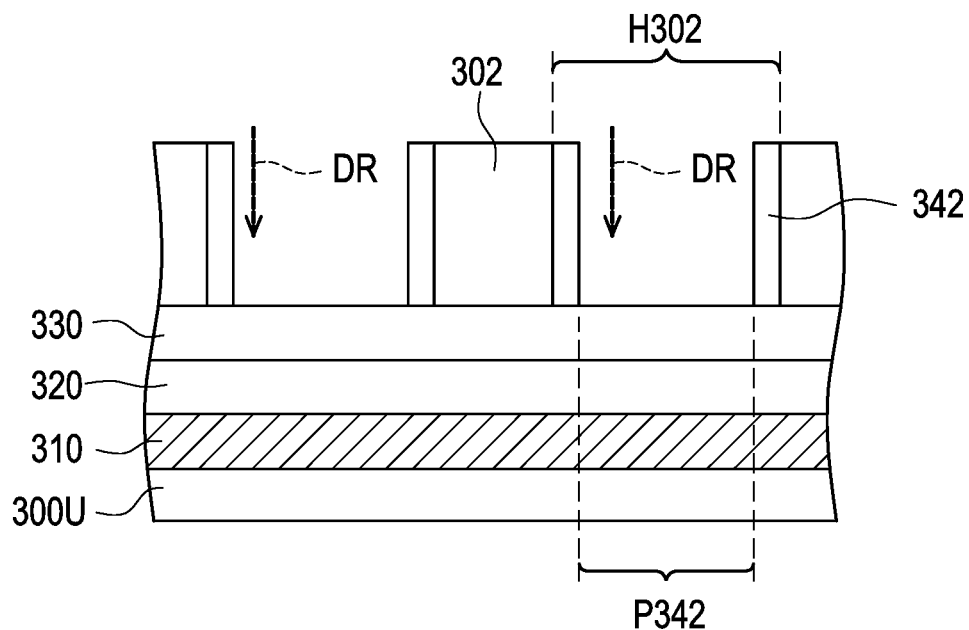

Referring to FIG. 4 and FIG. 5, a directional removing process DR is performed on the first liner material layer 342' so that the first liner material layer 342' is patterned to form a first liner 342. The directional removing process DR can include a directional etching process which presents a greater etching rate in the vertical direction than in the lateral direction. In some embodiments, the directional removing process DR can be a dry etching process, or the like. After the directional process DR, the second portion P2 and the third portion P3 of the first liner material layer 342' are removed and the first portion P1 of the first liner material layer 342' is remained to form the first liner 342.

In the embodiment, the first liner 342 is a sidewall liner and has an opening P342 exposing the semiconductor layer 330 within the contact hole H302. The first liner 342 can form a tube-like shape extending along the sidewall of the contact hole H302 of the interlayer dielectric 302 and surrounds a cylinder volume above the semiconductor layer 330. As shown in FIG. 5, a part of the top surface of the semiconductor layer 330 away from the gate dielectric layer 320 is in contact with the interlayer dielectric 302 and the first liner 342 and another part of the top surface of the semiconductor layer 330 is exposed at the opening P342.

Figure 6:
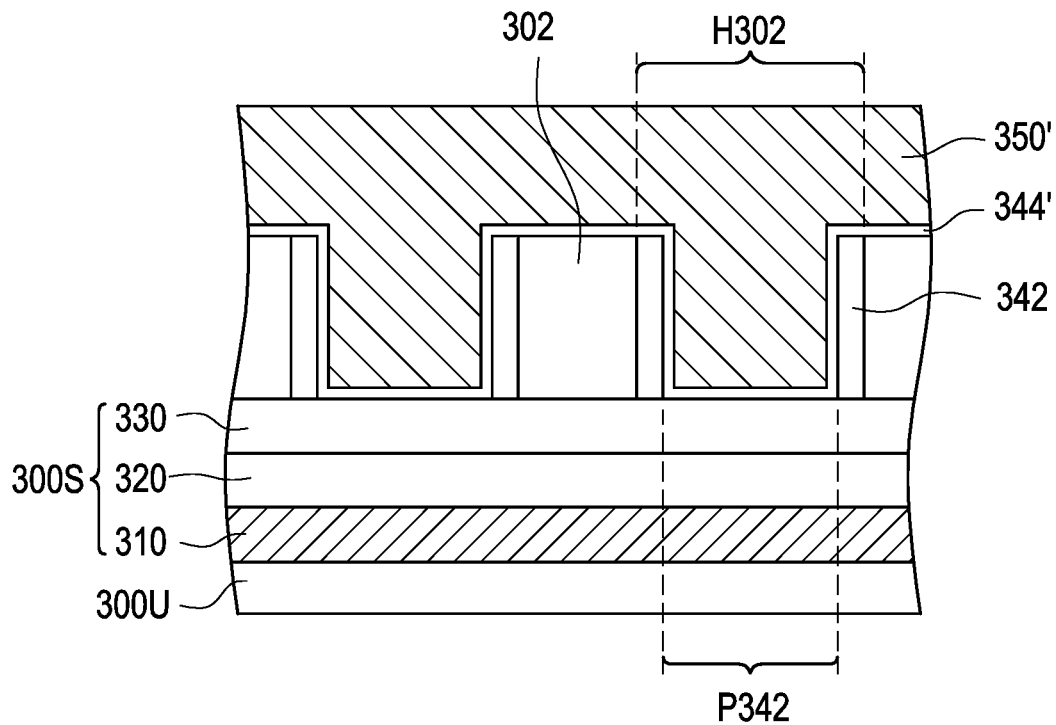

In FIG. 6, a second liner material layer 344' and a source/drain material layer 350' are sequentially formed on the interlayer dielectric 302. The second liner material layer 344' is formed in a conformal manner to cover the interlayer dielectric 302, the first liner 342 extending along the sidewall of the contact hole H302 and the semiconductor layer 330 exposed by the opening P342 of the first liner 342. The second liner material layer 344' can include TiN, Ti, W, Mo, heavily doped oxide semiconductor material, or the like. The source/drain material layer 350' is formed on the second liner material layer 344' and fills the volume surrounded by the second liner material layer 344' in the opening P342. The material of the source/drain material layer 350' can include TiN, Ti, W, Mo or the like. The second liner material layer 344' and the source/drain material layer 350' can be respectively formed by using a deposition process such as CVD (chemical vapor deposition) process, PVD (physical vapor deposition) process, ALD (atomic layer deposition) process, or the like. In some embodiments, CVD process can include plasma-enhanced chemical vapor deposition (PECVD) techniques or high-density plasma CVD (HDPCVD).

Figure 7:
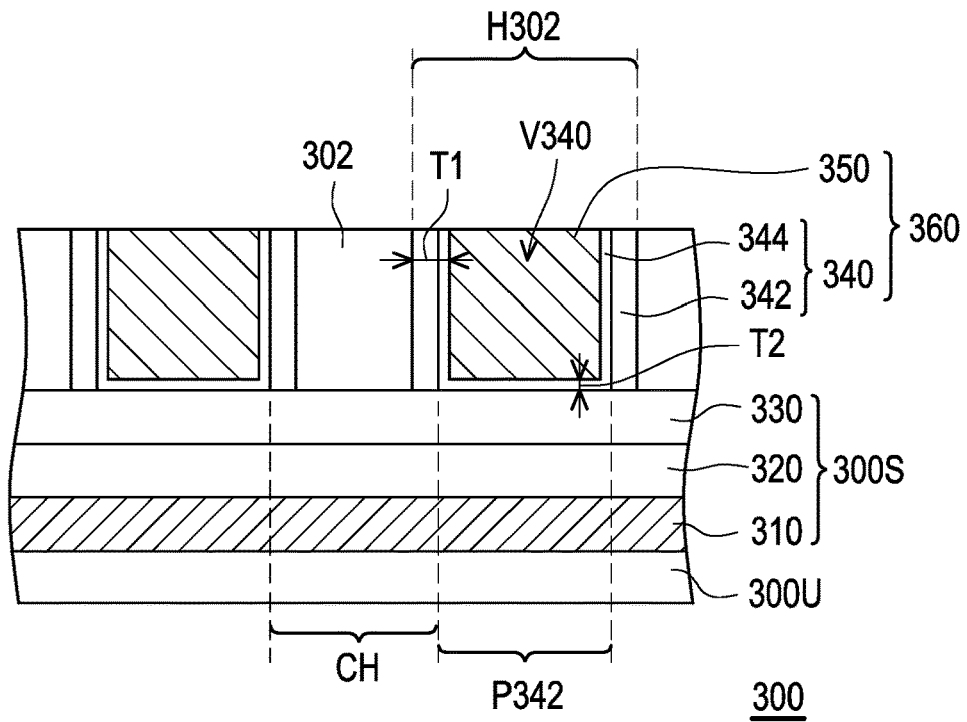

Referring to FIG. 6 and FIG. 7, a planarization process is performed on the source/drain material layer 350' and the second liner material layer 344' to form a thin film transistor 300 on the underlying layer 300U. The planarization process may include a chemical mechanical polishing (CMP) process, a grinding process, an etching process, a dry polishing process, one or more other applicable processes, or a combination thereof. The source/drain material layer 350' and the second liner material layer 344' are partially removed through the planarization process to form a source/drain metal 350 and a second liner 344 respectively. The source/drain metal 350 and the second liner 344 are coplanar at the side away from the semiconductor layer 330 and is leveled with the interlayer dielectric 302. Accordingly, in the plane view of the thin film transistor 300, the source/drain metal 350 is encircled by the second liner 344, the second liner 344 is encircled by the first liner 342 and the first liner 342 is encircled by the interlayer dielectric 302.

As shown in FIG. 7, the thin film transistor 300 includes the gate metal 310, the gate dielectric layer 320, the semiconductor layer 330, the interlayer dielectric 302 and a source/drain structure 360. The gate metal 310 is a metal pattern or a conductor pattern. The gate dielectric layer 320 is disposed on the gate metal 310 and the semiconductor layer 330 is disposed on the gate dielectric layer 320. The gate dielectric layer 320 is interposed between the gate metal 310 and the semiconductor layer 330 to prevent from a directly electrical connection between the gate metal 310 and the semiconductor layer 330. The interlayer dielectric 302 is disposed on the semiconductor layer 330 and has the contact hole H302 so that the interlayer dielectric 302 is not in contact with the semiconductor layer 330 at the contact hole H302. The source/drain structure 360 is disposed on the semiconductor layer 330 within the contact hole H302.

In the embodiment, the source/drain structure 360 includes a liner structure 340 and the source/drain metal 350. Specifically, the liner structure 340 forms an accommodating volume V340 within the contact hole H302 and the source/drain metal 350 fills the accommodating volume V340 of the liner structure 340. The liner structure 340 is disposed over the semiconductor layer 330 in the contact hole H302 and includes the first liner 342 and the second liner 344. The first liner 342 is disposed between the interlayer dielectric 302 and the source/drain metal 350. The second liner 344 is disposed between the first liner 342 and the source/drain metal 350. The first liner 342 has the opening P342 and does not cover the semiconductor layer 330 at the opening P342. The second liner 344 is in contact with the semiconductor layer 330 at the opening P342. In addition, the sidewall of the liner structure 340 includes the first liner 342 and the second liner 344 while the bottom of the liner structure 340 includes only the second liner 344, so that the liner structure 340 can have a thickness T1 at the sidewall thicker than a thickness T2 at the bottom. In some embodiments, the thickness of the first liner 342 can be ranged from 10 angstroms to 200 angstroms and the thickness of the second liner 344 can be ranged from 10 angstroms to 100 angstroms.

In some embodiments, the first liner 342 can include a material of non-nitride based material. The first liner 342 can involve a barrier effect that prevents from hydrogen diffusion from the interlayer dielectric 302 to the semiconductor layer 330. As such, the semiconductor layer 330 has desirable property to ensure the performance of the thin film transistor 300. The second liner 344 can serve as a glue layer that ensures the attachment of the material of the source/drain metal 350. The second liner 344 can present sufficient electric conductivity so that the contact resist between the source/drain structure 360 and the semiconductor layer 330 is desirable.

In some embodiments, the thin film transistor 300 includes two, paired source/drain structures 360. In the embodiment, the electric conduction between each source/drain structure 360 and the semiconductor layer 330 forms mainly at the interface between the second liner 344 and the semiconductor layer 330 so that the area of the second liner 342 in contact with the semiconductor layer 330 is considered as the contact area of the source/drain structure 360. The region of the semiconductor layer 330 between the contact areas of the paired source/drain structures 360 is considered as a channel CH of the thin film transistor 300. In the embodiment, the opening P342 of the first liner 342 defines the size and location of the contact area that the second liner 344 in contact with the semiconductor layer 330 so that the length and the width of the channel CH can be determined by the opening P342 without limiting by the size and position of the contact hole H302 of the interlayer dielectric 302. As such the design room for fabricating the thin film transistor 300 becomes flexible.

Figure 8:
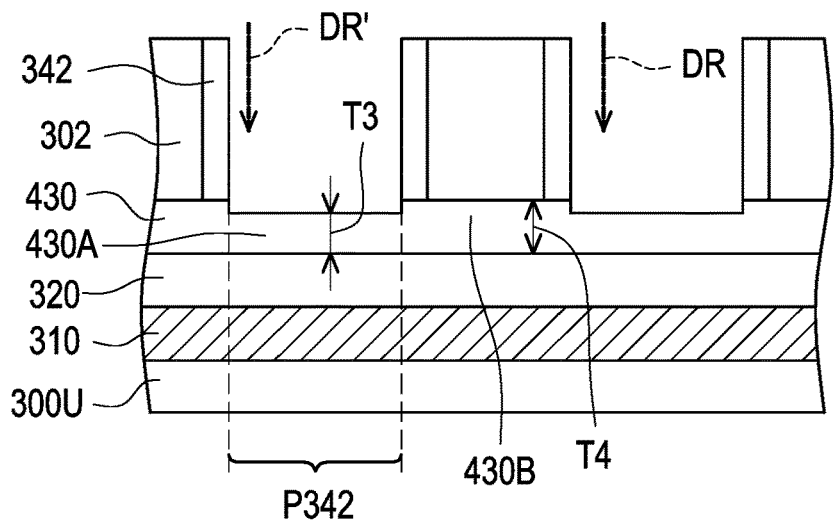
FIG. 8 through FIG. 10 schematically illustrate cross sectional structures showing respective steps of a method of fabricating a thin film transistor in accordance with some embodiments.
Figure 9:
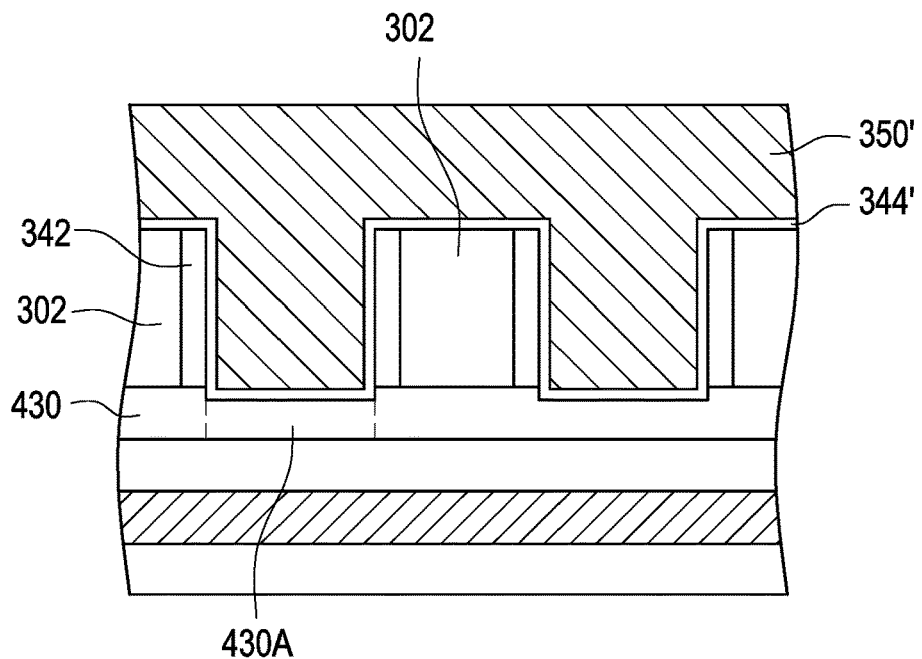
Figure 10:
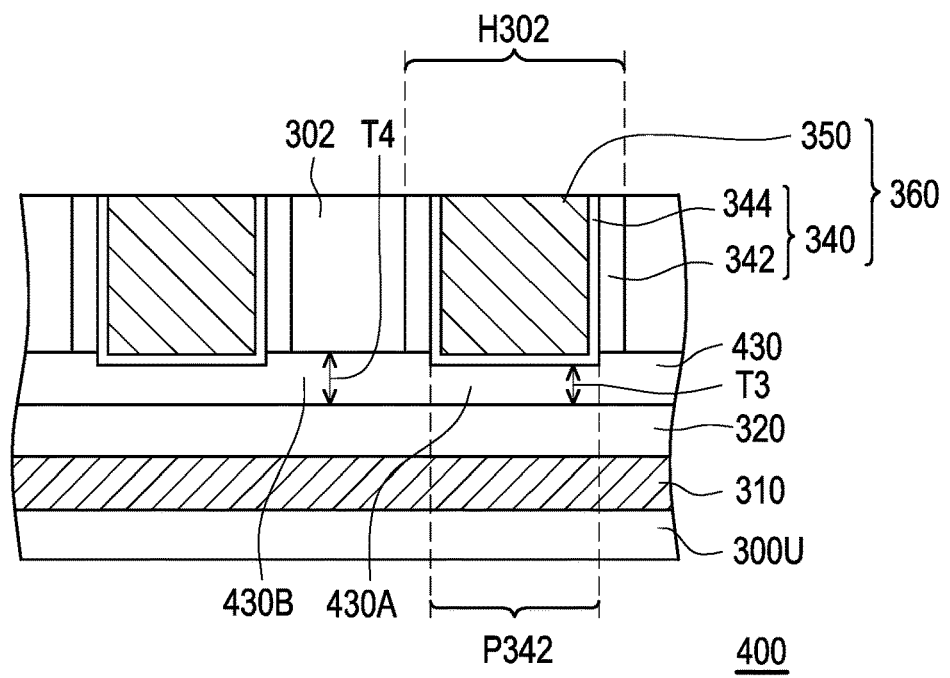

FIG. 8 through FIG. 10 schematically illustrate cross sectional structures showing respective steps of a method of fabricating a thin film transistor in accordance with some embodiments. In FIG. 8, a directional removing process DR' is performed after the step of FIG. 4. Specifically, the step of FIG. 8 is an alternate implemental example of the step of FIG. 5. In FIG. 8, the directional removing process DR' includes a directional etching process that has a higher etching rate in the vertical direction than in the lateral direction. Referring to FIG. 4 and FIG. 8, through the directional removing process DR', the first liner material layer 342' is patterned to form the first liner 342 and the opening P342, and simultaneously, the semiconductor layer 330 exposed in the opening P342 is partially removed under the directional removing process DR' to form the semiconductor layer 430. In the embodiment, the semiconductor layer 430 has a reduced thickness T3 at the opening P342. Specifically, the semiconductor layer 430 includes a portion 430A that is neither covered by the first liner 342 nor the interlayer dielectric 302 and a portion 430B that is covered by the first liner 342 or the interlayer dielectric 302. The portion 430A has the reduced thickness T3 that is smaller than the thickness T4 of the portion 430B. Accordingly, the semiconductor layer 430 has a recess at the opening P342. In some embodiments, the surface impurity of the semiconductor layer 320 such as unwanted contamination, unwanted oxidized materials or the like can be removed along with the removing of the material of the semiconductor layer 320 under the directional removing process DR', which facilitates to ensure the property of the semiconductor layer 322. In some alternative embodiments, the portion 430A exposed at the opening P342 can be completely removed under the directional removing process DR' so that the gate dielectric layer 320 can be exposed at the opening P342.

In FIG. 9, a second liner material layer 344' and a source/drain material layer 350' are formed on the interlayer dielectric 302, the first liner 342 and the semiconductor layer 430 by using the method and the materials that are depicted in the step of FIG. 6. The second liner material layer 344' is in contact with the portion 430A of the semiconductor layer 430 with the reduced thickness T3. In FIG. 10, a planarization process that is similar to the step of FIG. 7 is performed to pattern the second liner material layer 344' and the source/drain material layer 350' to the second liner 344 and the source/drain metal 350 and thus achieve a thin film transistor 400 disposed on the underlying layer 300U.

In FIG. 10, the thin film transistor 400 includes a gate metal 310, a gate dielectric layer 320, a semiconductor layer 430, an interlayer dielectric 302, and a source/drain structure 360, in which the source/drain structure 360 includes a liner structure 340 and a source/drain metal 350. The gate metal 310, the gate dielectric layer 320, the interlayer dielectric 302, the liner structure 340 and the source/drain metal 350 can be similar to those elements depicted in FIG. 7 and thus the descriptions for those elements in FIG. 7 are applicable and incorporated in the embodiment of FIG. 10. In the embodiment of FIG. 10, the semiconductor layer 430 has a portion 430A that is thinner than another portion 430B. In other words, the portion 430A has a reduced thickness T3 compared to the thickness T4 of the portion 430B. The portion 430A having the reduced thickness T3 is in contact with the second liner 344 of the liner structure 340 and the portion 430B is in contact with the first liner 342 of the liner structure 340 or the interlayer dielectric 302. In the embodiment, the second liner 344 is partially embedded in the semiconductor layer 340.

Figure 11:
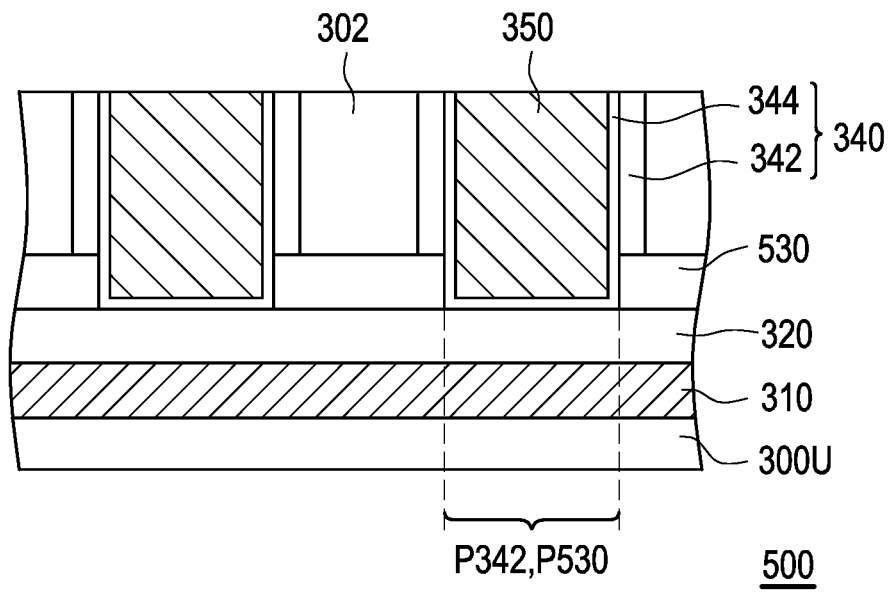
FIG. 11 schematically illustrates a cross sectional view of a thin film transistor in accordance with some embodiments of the disclosures.

FIG. 11 schematically illustrates a cross sectional view of a thin film transistor in accordance with some embodiments of the disclosures. In FIG. 11, a thin film transistor 500 is shown and is applicable to the semiconductor device 100 of FIG. 1. For example, the thin film transistor 500 can serve as an exemplary implemental example of the thin film transistor 200 in FIG. 1 and can be embedded in the interconnect structure 120 depicted in FIG. 1 and formed between the metal layer My−1 and the metal layer My of the interconnect structure 120 depicted in FIG. 1. Specifically, the thin film transistor 500 includes a gate metal 310, a gate dielectric layer 320, a semiconductor layer 530, an interlayer dielectric 302, and a source/drain structure 360, in which the source/drain structure 360 includes a liner structure 340 and a source/drain metal 350. The gate metal 310, the gate dielectric layer 320, the interlayer dielectric 302, the liner structure 340 and the source/drain metal 350 can be similar to those elements depicted in FIG. 7 and FIG. 10 and thus the descriptions for those elements in FIG. 7 and FIG. 10 are applicable and incorporated in the embodiment of FIG. 11.

In the embodiment, the semiconductor layer 530 has an opening P530 corresponding to the opening P342 of the first liner 342. Specifically, the thin film transistor 500 can be fabricated by using the steps depicted in FIG. 8 through FIG. 10, and for the thin film transistor 500, the step of FIG. 8 is performed to completely remove the semiconductor material exposed at the opening P342. In the embodiment, the edge of the semiconductor layer 530 at the opening P530 can be aligned with the edge of the first liner 342 at the opening P342 and the second liner 344 extends linearly along the edges of the first liner 342 and the semiconductor layer 530. In addition, the liner structure 340 extends through the semiconductor layer 530 and specifically, the bottom of the second liner 344 is in contact with the gate dielectric layer 320 at the opening P530 of the semiconductor layer 530.

Figure 12:
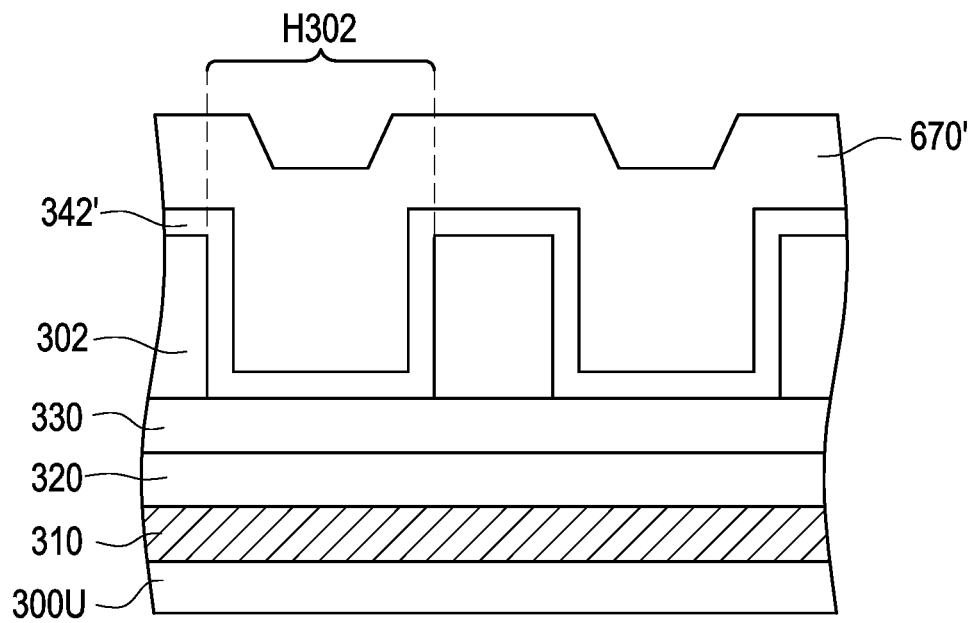
FIG. 12 through FIG. 17 schematically illustrate cross sectional structures showing respective steps of a method of fabricating a thin film transistor in accordance with some embodiments.

FIG. 12 through FIG. 17 schematically illustrate cross-sectional structures showing respective steps of a method of fabricating a thin film transistor in accordance with some embodiments. FIG. 12 shows a step performed after the step of FIG. 4. In other words, a method disclosed in the embodiment includes performing the steps of FIG. 2 to FIG. 4 before the step of FIG. 12. The structure shown in FIG. 12 includes an underlying layer 300U, a gate metal 310, a gate dielectric layer 320, a semiconductor layer 330, an interlayer dielectric 302, a first liner material layer 342' and a spacer material layer 670'. The gate metal 310, the gate dielectric layer 320 and the semiconductor layer 330 are sequentially stacked on the underlying layer 300U. The interlayer dielectric 302 is disposed on the semiconductor layer 330 and has a contact hole H302 that extends through the interlayer dielectric 302 in the vertical direction so that a portion of the semiconductor layer 330 is not covered by the interlayer dielectric 302 in the contact hole H302. The first liner material layer 342' is disposed on the interlayer dielectric 302 in a conformal manner. The first liner material layer 342' extends continuously on top surface of the interlayer dielectric 302, the sidewall of the contact hole H302 and the bottom of the contact hole H302 so that the first liner material layer 342' is in contact with the semiconductor layer 330 within the contact hole H302. The spacer material layer 670' is disposed on the first liner material layer 342' and the first liner material layer 342' is constantly interposed between the spacer material layer 670' and the semiconductor layer 330 as well as between the spacer material layer 670' and the interlayer dielectric 302.

Specifically, the step of FIG. 12 includes forming the spacer material layer 670' on the first liner material layer 342'. In some embodiments, the spacer material layer 670' can be formed by using a deposition process such as CVD (chemical vapor deposition) process, PVD (physical vapor deposition) process, ALD (atomic layer deposition) process, or the like. In some embodiments, CVD process can include plasma-enhanced chemical vapor deposition (PECVD) techniques or high-density plasma CVD (HDPCVD). The spacer material layer 670' is made of a material different from the first liner material layer 342'. In some embodiments, the material of the spacer material layer 670' can be a nitride based material such as silicon nitride or the like.

Figure 13:
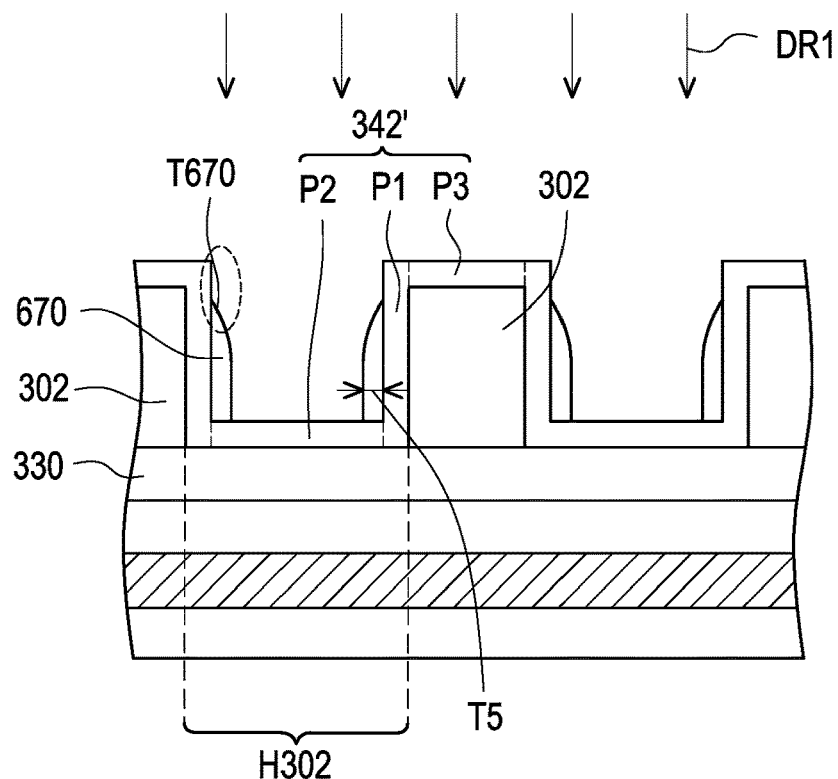

In FIG. 13, a directional removing process DR1 is performed on the spacer material layer 670' so that a sidewall spacer 670 is formed. The directional removing process DR1 can be a directional etching process that presents a higher etching rate in the vertical direction than in the lateral direction. The directional removing process DR1 utilizes an etchant that has selectivity between the spacer material layer 670' and the first liner material layer 342' so that the first liner material layer 342' is not removed under the step of FIG. 13. Specifically, the first liner material layer 342' includes a portion P1 extending along the sidewall of the contact hole H302 of the interlayer dielectric 302, a portion P2 extending along the bottom of the contact hole H302 and in contact with the semiconductor layer 330, and a portion P3 covering the top surface of the interlayer dielectric 302. After the direction removing process DR1 of FIG. 13, the spacer material layer 670' is partially removed to expose the portion P2 and the portion P3, and the remained part of the spacer material layer 670' extending along the portion P1 of the first liner material layer 342'. Accordingly, the sidewall spacer 670 extends along and is in contact with the first portion P1 of the first liner material layer 342' and overlaps a portion of the second portion P2 of the first liner material layer 342'. In some embodiment, the sidewall spacer 670 has a taper terminal T670 at the end away from the semiconductor layer 330 due to the directional removing process DR1. In other words, the sidewall spacer 670 can have an uneven thickness T5. In addition, the portion P2 of the first liner material layer 342' is partially covered by the sidewall spacer 670.

Figure 14:
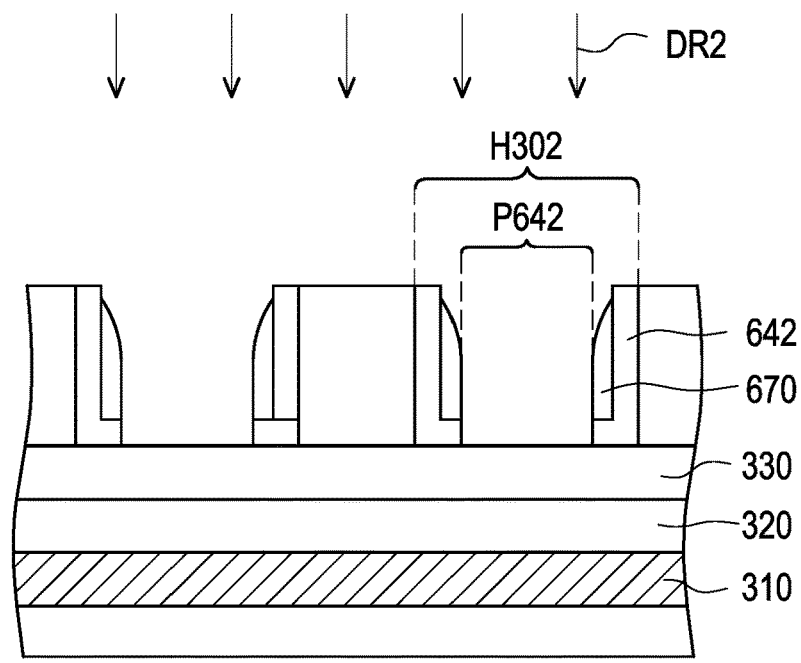

In FIG. 14, another directional removing process DR2 is performed on the first liner material layer 342' to form a first liner 642. The directional removing process DR2 can include a directional etching process which presents a greater etching rate in the vertical direction than in the lateral direction. In some embodiments, the directional removing process DR2 can be a dry etching process, or the like. Under the directional process DR2, the third portion P3 of the first liner material layer 342' is completely removed, the second portion P2 of the first liner material layer 342' is partially removed, and the remained part of the second portion P2 and the remained first portion P1 form the first liner 642.

In the embodiment, the directional removing process DR2 utilizes an etchant that has selectivity between the sidewall spacer 670 and the first liner material layer 342' so that the sidewall spacer 670 is not removed under the directional removing process DR2. The sidewall spacer 670 serves as a mask during the directional removing process DR2 so that the covered portion of the first liner material layer 342' by the sidewall spacer 670 is remained to form the first liner 642. The first liner 642 has an opening P642 that is formed by removing a part of the portion P2 of the first liner material layer 342' and exposes the semiconductor layer 330 at the opening P642. The edge of the sidewall spacer 670 and the edge of the first liner 642 corresponds to each other at the opening P642 since the sidewall spacer 670 serves as a mask during the patterning of the first liner 642. In some embodiments, the edge of the sidewall spacer 670 and the edge of the first liner 642 can be aligned with each other at the opening P642.

In some embodiments, the material of the sidewall spacer 670 can be different from the material of the first liner 642. The material of the sidewall spacer 670 and the material of the first liner 642 can be so choose that the directional removing process DR1 and the directional removing process DR2 present desirable selectivity between the two materials. For example, the material of the sidewall spacer 670 can include nitride material while the material of the first liner 642 can include a non-nitride based material. In some embodiments, the material of the sidewall spacer 670 can be SiN. Also, the etchant utilized in the directional removing process DR1 and the directional removing process DR2 can be determined based on the material of the sidewall spacer 670 and the material of the first liner 642. In addition, the processing condition of the directional removing process DR1 and the directional removing process DR2 can be adjusted so that the materials extending vertically along the sidewall of the contact hole H302 are remained.

Figure 15:
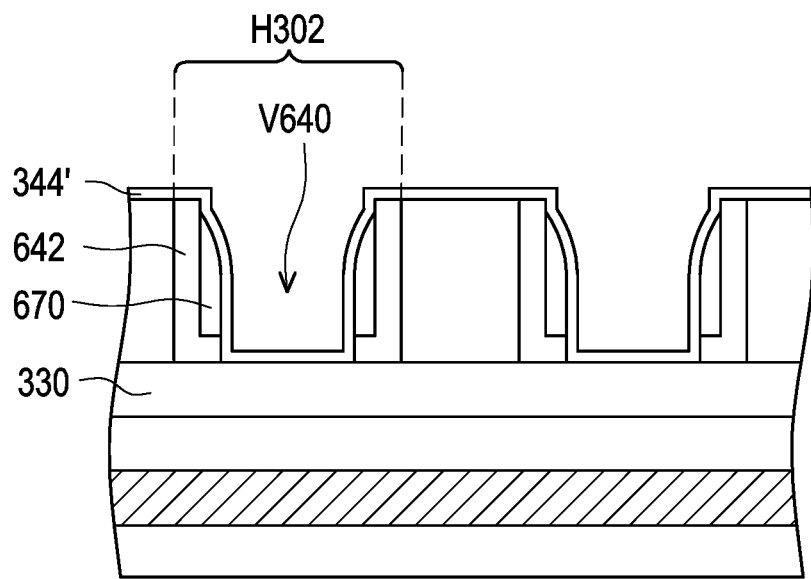

In FIG. 15, a second liner material layer 344' is formed on the interlayer dielectric 302. The second liner material layer 344' covers along the structure constituted by the interlayer dielectric 302, the first liner 642, the sidewall spacer 670 and the semiconductor layer 330. The second liner material layer 344' can include TiN, Ti, W, Mo, heavily doped oxide semiconductor material, or the like. The second liner material layer 344' can be formed by using a deposition process such as CVD (chemical vapor deposition) process, PVD (physical vapor deposition) process, ALD (atomic layer deposition) process, or the like. In some embodiments, CVD process can include plasma-enhanced chemical vapor deposition (PECVD) techniques or high-density plasma CVD (HDPCVD).

Figure 16:
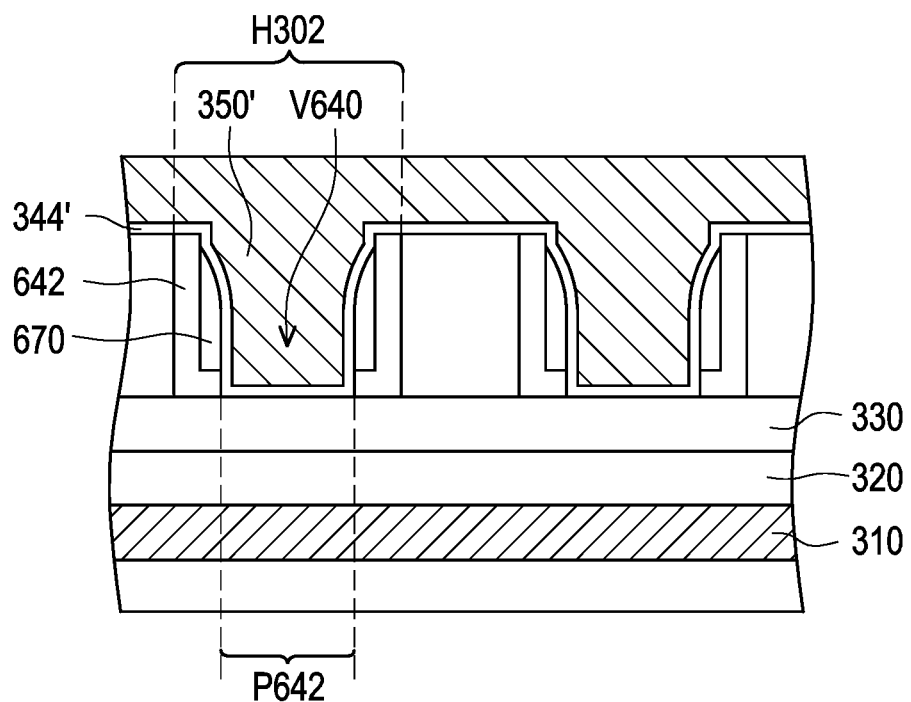

In FIG. 16, a source/drain material layer 350' are formed on the second liner material layer 344'. The first liner 642, the sidewall spacer 670 and the second liner material layer 344' form an accommodating volume V640 within the contact hole H302 and the source/drain material layer 350' fills the accommodating volume V640. The source/drain material layer 350' can be formed by using a deposition process such as CVD (chemical vapor deposition) process, PVD (physical vapor deposition) process, ALD (atomic layer deposition) process, or the like. In some embodiments, CVD process can include plasma-enhanced chemical vapor deposition (PECVD) techniques or high-density plasma CVD (HDPCVD). The material of the source/drain material layer 350' can include TiN, Ti, W, Mo or the like.

Figure 17:
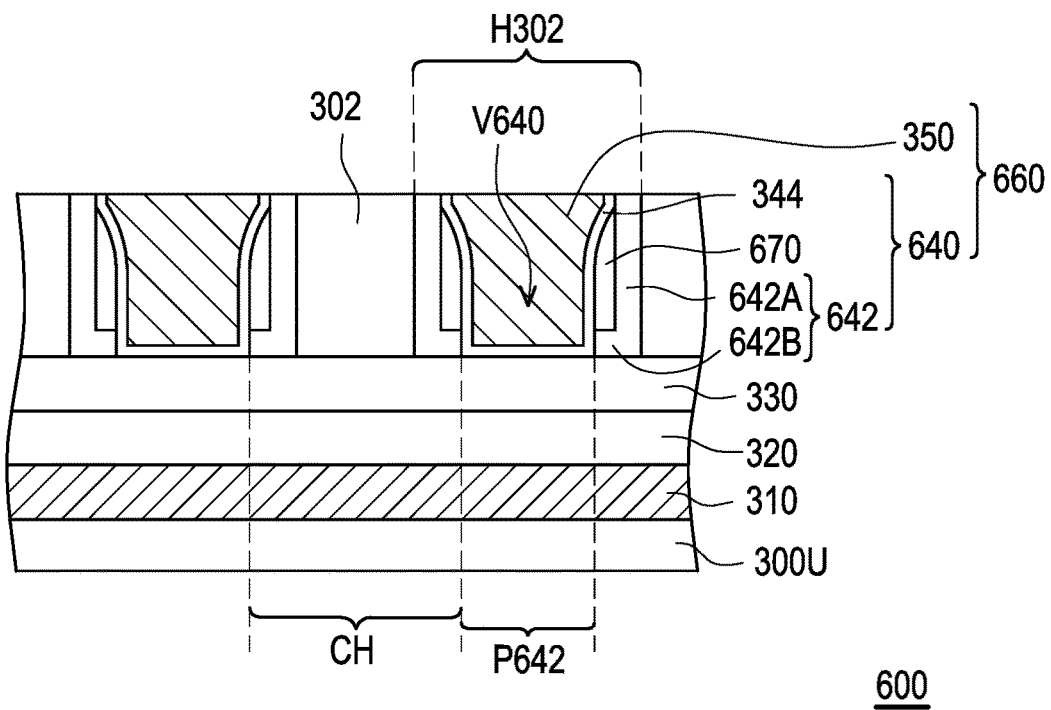

Referring to FIG. 16 and FIG. 17, a planarization process is performed on the source/drain material layer 350' and the second liner material layer 344' to form a thin film transistor 600 on the underlying layer 300U. The planarization process may include a chemical mechanical polishing (CMP) process, a grinding process, an etching process, a dry polishing process, one or more other applicable processes, or a combination thereof. The source/drain material layer 350' and the second liner material layer 344' are partially removed through the planarization process to form a source/drain metal 350 and a second liner 344 respectively. The source/drain metal 350 and the second liner 344 are coplanar at respective top surfaces away from the semiconductor layer 330 and are leveled with the interlayer dielectric 302.

The thin film transistor 600 formed on the underlying layer 300U can be applicable in the semiconductor device 100 depicted in FIG. 1 and served as an exemplary implemental example of the thin film transistor 200. Therefore, the thin film transistor 600 can be integrated in the interconnect structure 120 of the semiconductor device 100 and the method of fabricating the thin film transistor 600 is compatible with the manufacturing processes of BEOL.

The thin film transistor 600 includes the gate metal 310, the gate dielectric layer 320, the semiconductor layer 330, the interlayer dielectric 302, and a source/drain structure 660. The gate metal 310, the gate dielectric layer 320, the semiconductor layer 330, and the interlayer dielectric 302 are similar to the same elements disclosed in the previous embodiments so that the details of the gate metal 310, the gate dielectric layer 320, the semiconductor layer 330, and the interlayer dielectric 302 disclosed in previous embodiments are applicable to and incorporated in the thin film transistor 600 and are not reiterated.

The source/drain structure 660 in the embodiment includes the liner structure 640 and the source/drain metal 350. The liner structure 640 is disposed within the contact hole H302 and forms the accommodating volume V640 for accommodating the source/drain metal 350. The liner structure 640 is a composite structure constructed by multiple layers and includes the first liner 642, the sidewall spacer 670 and the second liner 344. The first liner 642 is disposed within the contact hole H302 of the interlayer dielectric 302 and has an opening P642. The semiconductor layer 330 is not covered by the first liner 642 within the opening P642. The sidewall spacer 670 is disposed between the first liner 642 and the second liner 344 and is substantially encircled and sandwiched by the first liner 642 and the second liner 344. The second liner 344 covers the sidewall spacer 670 and is in contact with the semiconductor layer 330 within the opening P642. The liner structure 640 separates the source/drain metal 350 from the interlayer dielectric 302 through a multi-layered sidewall that includes the first liner 642, the sidewall spacer 670 and the second liner 344, and separates the source/drain metal 350 from the semiconductor layer 330 through a single-layered bottom that includes the second liner 344. Therefore, the liner structure 640 can have the sidewall thicker than the bottom.

In the embodiment, the first liner 642 can include a vertical portion 642A and a lateral protrusion 642B. The vertical portion 642A of the first liner 642 is in contact with the interlayer dielectric 302 and extends along the sidewall of the contact hole H302. The lateral protrusion 642B is in contact with the semiconductor layer 330 and laterally protrudes away from the interlayer dielectric 302 along the surface of the semiconductor layer 330. The lateral protrusion 642B is formed by using the sidewall spacer 670 as mask during the step of FIG. 13 and the opening P642 of the first liner 642 is defined by the lateral protrusion 642B. In some embodiments, the first liner 642 can have a barrier effect that prevents from the hydrogen diffusion from the interlayer dielectric 302 to the semiconductor layer 330 so as to ensure the performance of the thin film transistor 600.

The sidewall spacer 670 is made of a material different from the first liner 642 and the second liner 344, and has a taper terminal gradually thinner away from the semiconductor layer 330. The sidewall spacer 670 is spaced from the semiconductor layer 330 by the first liner 642. In other words, the first liner 642 is interposed between the sidewall spacer 670 and the semiconductor layer 330 so that the sidewall spacer 670 is not in contact with the first liner 642. The first liner 642 can be a barrier that prevents from the hydrogen diffusion from the sidewall spacer 670 to the semiconductor layer 330.

The second liner 344 is lined under the source/drain metal 350. The thin film transistor 600 includes two, paired source/drain structures 660, and each of the source/drain structures 660 includes the liner structure 640 lining the source/drain metal 350. In the embodiment, the area of the second liner 344 in contact with the semiconductor layer 330 in each contact hole H302 is considered as the contact area of the source/drain structure 660 and a region of the semiconductor layer 330 between the contact areas of the paired source/drain structures 660 defines a channel CH of the thin film transistor 600. The opening P642 of the first liner 642 in the liner structure 640 substantially determines the location and the size of the contact area of the source/drain structure 660 as well as the length and the width of the channel CH. Accordingly, the length and the width of the channel CH is not limited to the contact hole H302 of the interlayer dielectric 302 and can be adjusted based on various designs. In addition, the location and the size of the opening P642 of the first liner 642 is determined by the sidewall spacer 670 so that the sidewall spacer 670 facilitates the design flexibility of the thin film transistor 600. For example, in consideration of having a smaller contact area of the source/drain structure 660, the sidewall spacer 670 can be formed to be thicker by adjusting the condition of the step of FIG. 13.

Figure 18:
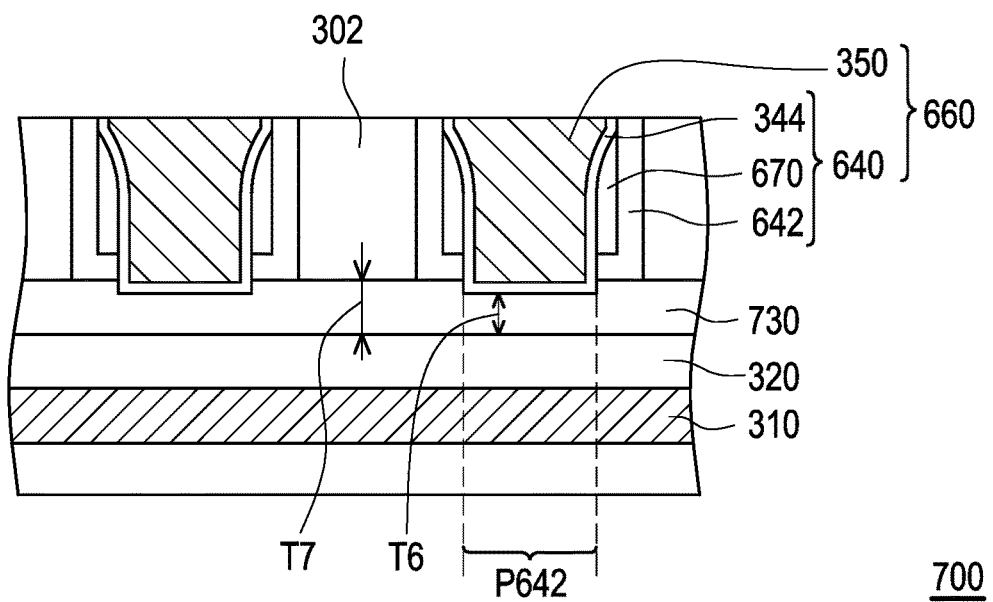
FIG. 18 schematically illustrates a cross sectional view of a thin film transistor in accordance with some embodiments of the disclosure.

FIG. 18 schematically illustrates a cross sectional view of a thin film transistor in accordance with some embodiments of the disclosure. A thin film transistor 700 in FIG. 18 is similar to the thin film transistor 600 in the previous embodiment and includes a gate metal 310, a gate dielectric layer 320, a semiconductor layer 730, an interlayer dielectric 302, a source/drain structure 660, in which the source/drain structure 660 includes a liner structure 640 and a source/drain metal 350. The details of the gate metal 310, the gate dielectric layer 320, the interlayer dielectric 302, the liner structure 640 and the source/drain metal 350 can refer to the description of the same elements depicted in FIG. 17 and are not reiterated. In the embodiment, the semiconductor layer 730 has an uneven thickness and specifically has a reduced thickness T6 at the opening P642 of the first liner 642 in the liner structure 640 and a thickness T7 outside the opening P642. The thickness T7 is greater than the thickness T6. In addition, the second liner 344 of the liner structure 640 is partially embedded in the semiconductor layer 730.

The thin film transistor 700 can be fabricated by performing the steps of FIG. 12 to FIG. 17. Specifically, the step of FIG. 14 for fabricating the thin film transistor 700 is performed to further remove a portion of the semiconductor layer 330 exposed by the opening P642 so that the semiconductor layer 730 is formed to have the uneven thickness. The removing of a portion of the semiconductor layer 330 exposed by the opening P642 facilitates to remove the impurity or unwanted oxidized material on the surface of the semiconductor layer 330 so as to ensure the performance of the thin film transistor 700. In some embodiments, the step of FIG. 14 can be performed to remove the entire thickness of the semiconductor layer 330 exposed by the opening P642 so the gate dielectric layer 320 is not covered by the semiconductor material of the semiconductor layer 330 at the opening P642 and the second liner 344 can be in contact with the gate dielectric layer 320, which is similar to the contact relationship of the second liner 344 and the gate dielectric layer 320 shown in FIG. 11.

Figure 19:
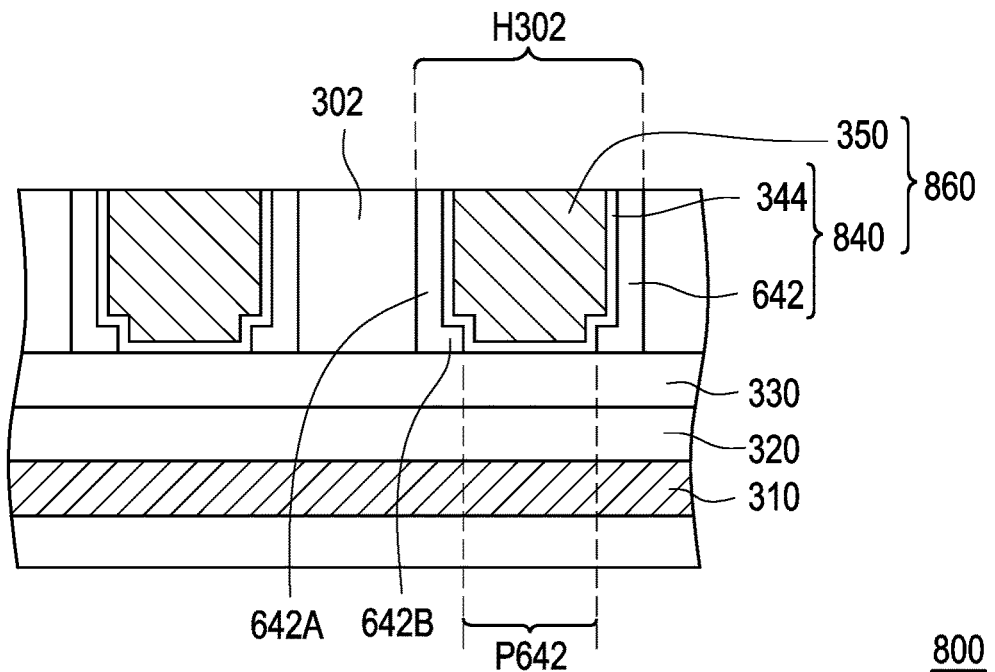
FIG. 19 schematically illustrates a cross sectional view of a thin film transistor in accordance with some embodiments of the disclosure.

FIG. 19 schematically illustrates a cross sectional view of a thin film transistor in accordance with some embodiments of the disclosure. A thin film transistor 800 in FIG. 19 is similar to the thin film transistor 600 in the previous embodiment and includes a gate metal 310, a gate dielectric layer 320, a semiconductor layer 330, an interlayer dielectric 302, and a source/drain structure 860, in which the source/drain structure 860 includes a liner structure 840 and a source/drain metal 350. The details of the gate metal 310, the gate dielectric layer 320, the semiconductor layer 330, the interlayer dielectric 302, and the source/drain metal 350 can refer to the descriptions of the same elements depicted in FIG. 17 and are not reiterated. In the embodiment, the liner structure 840 includes a first liner 642 and a second liner 344. Specifically, the first liner 642 and the second liner 344 in FIG. 19 can be fabricated by using the steps of FIG. 12 to FIG. 15, but a further removing process is performed between the step of FIG. 14 and the step of FIG. 15 so that the sidewall spacer 670 shown in FIG. 14 is removed and thus in FIG. 19, the first liner 642 is in direct contact with the second liner 344 along the sidewall of the contact hole H302 of the interlayer dielectric layer 302. In some embodiments, the further removing process is performed between the step of FIG. 14 and the step of FIG. 15 can utilize the etchant used in the directional removing process DR1 to remove the material of the sidewall spacer 670. In some embodiments, the removing of the material of the sidewall spacer 670 can be done through a suitable selective etching process.

As shown in FIG. 19, the liner structure 840 includes the first liner 642 and the second liner 344. The first liner 642 can include a vertical portion 642A and a lateral protrusion 642B. The vertical portion 642A of the first liner 642 is in contact with the interlayer dielectric 302 and extends along the sidewall of the contact hole H302. The lateral protrusion 642B is in contact with the semiconductor layer 330 and laterally protrudes away from the interlayer dielectric 302 along the surface of the semiconductor layer 330. In addition, the second liner 344 is in direct contact with the vertical portion 642A and the lateral protrusion 642B. In other words, no interposed layer exists between the first liner 642 and the second liner 344.

Figure 20:
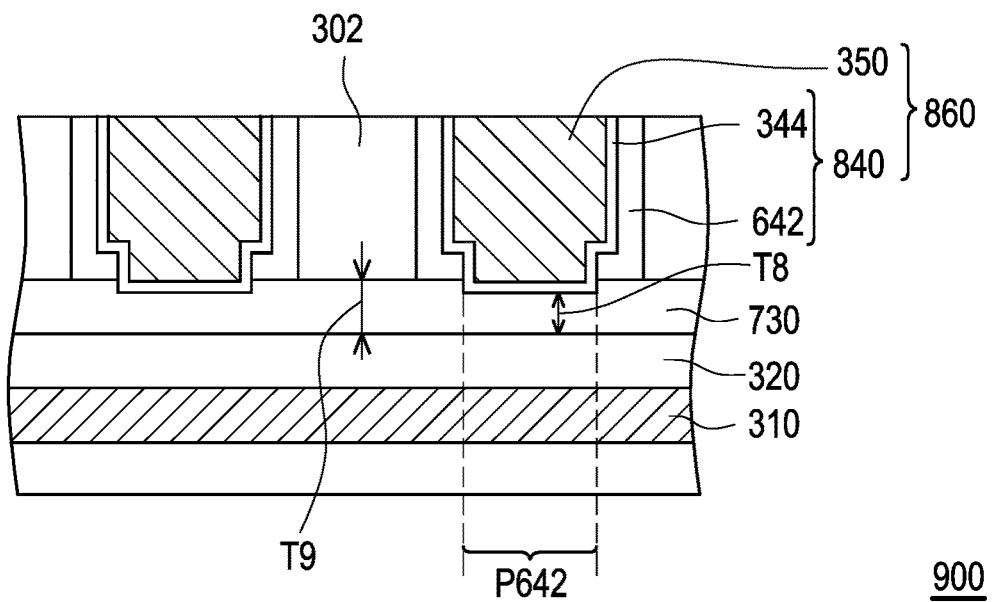
FIG. 20 schematically illustrates a cross sectional view of a thin film transistor in accordance with some embodiments of the disclosure.

FIG. 20 schematically illustrates a cross sectional view of a thin film transistor in accordance with some embodiments of the disclosure. A thin film transistor 900 in FIG. 20 is similar to the thin film transistor 800 in the previous embodiment and includes a gate metal 310, a gate dielectric layer 320, a semiconductor layer 730, an interlayer dielectric 302, and a source/drain structure 860, in which the source/drain structure 860 includes a liner structure 840 and a source/drain metal 350. The details of the gate metal 310, the gate dielectric layer 320, the interlayer dielectric 302, the liner structure 840 and the source/drain metal 350 can refer to the description of the same elements depicted in FIG. 19 and are not reiterated. In the embodiment, the semiconductor layer 730, similar to the same element depicted in FIG. 18, has an uneven thickness and specifically has a reduced thickness T8 at the opening P642 of the first liner 642 in the liner structure 840 and a thickness T9 outside the opening P642. The thickness T9 is greater than the thickness T8. In addition, the second liner 344 of the liner structure 640 is partially embedded in the semiconductor layer 730.

The thin film transistor 900 can be fabricated by performing the steps of FIG. 12 to FIG. 17 and a further step of removing the sidewall spacer 670 between the step of FIG. 14 and the step of FIG. 15. In addition, a portion of the semiconductor layer 330 exposed by the opening P642 is removed during the step of FIG. 14, which facilitates to remove the impurity or unwanted oxidized material on the surface of the semiconductor layer 330 so as to ensure the performance of the thin film transistor 900. In some embodiments, the step of FIG. 14 can be performed until the entire thickness of the semiconductor layer 330 exposed by the opening P642 is removed so the gate dielectric layer 320 is not covered by the semiconductor material of the semiconductor layer 330 and the second liner 344 can be in contact with the gate dielectric layer 310, which is similar to the contact relationship of the second liner 344 and the gate dielectric layer 320 shown in FIG. 11.

In accordance with some embodiments of the disclosure, the thin film transistor can be embedded in the interconnect structure of a semiconductor device by using steps compatible with the manufacturing processes of BEOL. The thin film transistor in some embodiments includes a source/drain structure forming by a liner structure accommodating the source/drain metal, where the liner structure is a multilayered structure. In some embodiments, the sidewall of the liner structure has a multi-layered structure and the bottom of the liner structure in contact with the semiconductor layer has a single-layered structure. A first liner in the liner structure is patterned to have an opening exposing the semiconductor layer to define the contact area of the source/drain structure and the semiconductor layer. Therefore, the design room of the thin film transistor becomes flexible to expand the application of the integrated thin film transistor. In some embodiments, the contact resistance between the source/drain structure and the semiconductor layer can be optimized by adjusting the structural design of the liner structure. In some embodiments, the liner structure can be a barrier blocking the diffusion of hydrogen from existing layers to the semiconductor layer, which helps to ensure the property of the semiconductor layer and the performance of the thin film transistor.

In accordance with some embodiments, a thin film transistor includes a gate metal; a gate dielectric layer disposed on the gate metal; a semiconductor layer disposed on the gate dielectric layer; an interlayer dielectric disposed on the semiconductor layer and having a contact hole over the semiconductor layer; a source/drain metal disposed in the contact hole; a first liner disposed between the interlayer dielectric and the source/drain metal; and a second liner disposed between the first liner and the source/drain metal and being in contact with the semiconductor layer in the contact hole. The first liner has an opening and the second liner is in contact with the semiconductor layer in the opening. The first liner has a vertical portion in contact with the interlayer dielectric and extending along the contact hole, and a lateral protrusion in contact with the semiconductor layer and laterally protruding away from the interlayer dielectric. A sidewall spacer is further disposed between the first liner and the second liner. The sidewall spacer has a taper terminal gradually thinner away from the semiconductor layer. The first liner extends between the sidewall spacer and the semiconductor layer. A portion of the semiconductor layer in contact with the second liner has a reduced thickness. The semiconductor layer has an opening and the second liner is in contact with the gate dielectric layer at the opening. The semiconductor layer is made of an oxide semiconductor material.

In accordance with some embodiments of the disclosure, a semiconductor device includes a semiconductor structure comprising a semiconductor component; an interconnect structure disposed on the semiconductor structure, electrically connected to the semiconductor component; and a thin film transistor embedded in the interconnect structure. The thin film transistor includes a gate metal; a gate dielectric layer disposed on the gate metal; a semiconductor layer disposed on the gate dielectric layer; an interlayer dielectric disposed on the semiconductor layer and having a contact hole over the semiconductor layer; a liner structure disposed in the contact hole and forming an accommodating volume, wherein the liner structure has a thicker thickness at a sidewall than at a bottom; and a source/drain metal filling the accommodating volume, wherein the liner structure is interposed between the source/drain metal and the semiconductor layer and between the source/drain metal and the interlayer dielectric. The sidewall of the liner structure comprises a first liner, a second liner and a sidewall spacer between the first liner and the second liner. A material of the sidewall spacer is different from the first liner and the second liner. The liner structure is partially embedded in the semiconductor layer. The liner structure extends through the semiconductor layer and the liner structure is in contact with the gate dielectric layer.

In accordance with some embodiments of the disclosure, a method of fabricating a thin film transistor includes forming a stack structure of a gate metal, a gate dielectric layer, and a semiconductor layer; forming an interlayer dielectric on the stack structure, wherein the interlayer dielectric has a contact hole exposing the semiconductor layer; forming a first liner material layer on the interlayer dielectric; performing a directional removing process on the first liner material layer to form a first liner, wherein the first liner has an opening exposing the semiconductor layer; forming a second liner on the first liner, wherein the second liner is in contact with the semiconductor layer in the opening; and forming a source/drain metal on the second liner. The first liner material layer is formed to comprise a first portion in contact with the interlayer dielectric at a sidewall of the contact hole, a second portion in contact with the semiconductor layer within the contact hole, and a third portion in contact with a top surface of the interlayer dielectric. The third portion of the first liner material layer is removed under the directional removing process. The second portion of the first liner material layer is at least partially removed under the directional removing process. A sidewall spacer is further formed on the first liner material layer, wherein the sidewall spacer extends along and is in contact with the first portion of the first liner material layer and overlaps a portion of the second portion of the first liner material layer. The directional removing process utilizes an etchant that has selectivity between the sidewall spacer and the first liner material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A thin film transistor comprising:
   a gate metal;
   a gate dielectric layer disposed on the gate metal;
   a semiconductor layer disposed on the gate dielectric layer;
   an interlayer dielectric disposed on the semiconductor layer and having a contact hole over the semiconductor layer;
   a source/drain metal disposed in the contact hole;
   a first liner disposed between the interlayer dielectric and the source/drain metal; and
   a second liner disposed between the first liner and the source/drain metal and being in contact with the semiconductor layer in the contact hole, wherein the first liner is made of a material different from the second liner to form a lateral barrier laterally surrounding the source/drain metal and interposing between the interlayer dielectric and the source/drain metal.

2. The thin film transistor of claim 1, wherein the first liner has an opening and the second liner is in contact with the semiconductor layer in the opening.

3. The thin film transistor of claim 1, wherein the first liner has a vertical portion in contact with the interlayer dielectric and extending along the contact hole, and a lateral protrusion in contact with the semiconductor layer and laterally protruding away from the interlayer dielectric.

4. The thin film transistor of claim 1, wherein a portion of the semiconductor layer in contact with the second liner has a reduced thickness.

5. The thin film transistor of claim 1, wherein the semiconductor layer has an opening and the second liner is in contact with the gate dielectric layer at the opening.

6. The thin film transistor of claim 1, wherein the semiconductor layer is made of an oxide semiconductor material.

7. The thin film transistor of claim 1, further comprising a sidewall spacer disposed between the first liner and the second liner.

8. The thin film transistor of claim 7, wherein the sidewall spacer has a taper terminal gradually thinner away from the semiconductor layer.

9. The thin film transistor of claim 7, wherein the first liner extends between the sidewall spacer and the semiconductor layer.

10. A semiconductor device comprising:
   a semiconductor structure comprising a semiconductor component;
   an interconnect structure disposed on the semiconductor structure, electrically connected to the semiconductor component; and
   a thin film transistor embedded in the interconnect structure, wherein the thin film transistor comprises:
      a gate metal;
      a gate dielectric layer disposed on the gate metal;
      a semiconductor layer disposed on the gate dielectric layer;
      an interlayer dielectric disposed on the semiconductor layer and having a contact hole over the semiconductor layer;
      a liner structure disposed in the contact hole and forming an accommodating volume, wherein the liner structure has a thicker thickness at a sidewall than at a bottom; and
      a source/drain metal filling the accommodating volume, wherein the liner structure is interposed between the source/drain metal and the semiconductor layer and between the source/drain metal and the interlayer dielectric, wherein the liner structure comprises a lateral barrier made of a material different from the source/drain metal to laterally surround the source/drain metal and interpose between the interlayer dielectric and the source/drain metal.

11. The semiconductor device of claim 10, wherein the sidewall of the liner structure comprises a first liner, a second liner and a sidewall spacer between the first liner and the second liner.

12. The semiconductor device of claim 11, wherein a material of the sidewall spacer is different from the first liner and the second liner.

13. The semiconductor device of claim 11, wherein the liner structure is partially embedded in the semiconductor layer.

14. The semiconductor device of claim 11, wherein the liner structure extends through the semiconductor layer and the liner structure is in contact with the gate dielectric layer.

15. A method of fabricating a thin film transistor comprising:
   forming a stack structure of a gate metal, a gate dielectric layer, and a semiconductor layer;
   forming an interlayer dielectric on the stack structure, wherein the interlayer dielectric has a contact hole exposing the semiconductor layer;
   forming a first liner material layer on the interlayer dielectric;
   performing a directional removing process on the first liner material layer to form a first liner, wherein the first liner has an opening exposing the semiconductor layer;
   forming a second liner on the first liner, wherein the second liner is in contact with the semiconductor layer in the opening; and
   forming a source/drain metal on the second liner.

16. The method of claim 15, wherein the first liner material layer is formed to comprise a first portion in contact with the interlayer dielectric at a sidewall of the contact hole, a second portion in contact with the semiconductor layer within the contact hole, and a third portion in contact with a top surface of the interlayer dielectric.

17. The method of claim 16, wherein the third portion of the first liner material layer is removed under the directional removing process.

18. The method of claim 16, wherein the second portion of the first liner material layer is at least partially removed under the directional removing process.

19. The method of claim 16, further forming a sidewall spacer on the first liner material layer, wherein the sidewall spacer extends along and is in contact with the first portion of the first liner material layer and overlaps a portion of the second portion of the first liner material layer.

20. The method of claim 19, wherein the directional removing process utilizes an etchant that has selectivity between the sidewall spacer and the first liner material layer.

* * * * *